US008987126B2

(12) United States Patent
Choi et al.

(10) Patent No.: US 8,987,126 B2
(45) Date of Patent: Mar. 24, 2015

(54) INTEGRATED CIRCUIT AND METHOD FOR FABRICATING THE SAME HAVING A REPLACEMENT GATE STRUCTURE

(75) Inventors: Kisik Choi, Hopewell Junction, NY (US); Hoon Kim, Guilderland, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/467,659

(22) Filed: May 9, 2012

(65) Prior Publication Data

US 2013/0299922 A1 Nov. 14, 2013

(51) Int. Cl.
| | |
|---|---|
| H01L 21/3205 | (2006.01) |
| H01L 21/8234 | (2006.01) |
| H01L 21/8238 | (2006.01) |
| H01L 29/51 | (2006.01) |
| H01L 29/66 | (2006.01) |

(52) U.S. Cl.
CPC .. *H01L 21/82345* (2013.01); *H01L 21/823462* (2013.01); *H01L 21/823475* (2013.01); *H01L 21/823842* (2013.01); *H01L 21/823857* (2013.01); *H01L 21/823871* (2013.01); *H01L 29/517* (2013.01); *H01L 29/66545* (2013.01)
USPC ........... 438/591; 438/592; 438/287; 257/391; 257/410; 257/411; 257/E21.177

(58) Field of Classification Search
CPC .................. H01L 21/28185; H01L 21/28229; H01L 21/4763; H01L 21/823462; H01L 21/823842; H01L 21/823857; H01L 29/517; H01L 29/66545

USPC .................. 438/287, 591, 592; 257/410, 411, 257/E21.177
See application file for complete search history.

(56) References Cited

U.S. PATENT DOCUMENTS

| | | | | |
|---|---|---|---|---|
| 6,033,963 | A * | 3/2000 | Huang et al. .................. | 438/303 |
| 8,357,604 | B2 * | 1/2013 | Hoentschel et al. .......... | 438/592 |
| 2007/0210354 | A1 * | 9/2007 | Nabatame et al. ............. | 257/288 |
| 2009/0108294 | A1 * | 4/2009 | Choi et al. ..................... | 257/190 |
| 2010/0330795 | A1 * | 12/2010 | Wang et al. ................... | 438/592 |
| 2013/0099320 | A1 * | 4/2013 | Lee et al. ....................... | 257/368 |
| 2013/0214364 | A1 * | 8/2013 | Jagannathan et al. ........ | 257/392 |

* cited by examiner

*Primary Examiner* — Tucker Wright
*Assistant Examiner* — Mark Hatzilambrou
(74) *Attorney, Agent, or Firm* — Ingrassia Fisher & Lorenz, P.C.

(57) ABSTRACT

Integrated circuits and methods of fabricating integrated circuits are provided herein. In an embodiment, a method of fabricating an integrated circuit includes depositing a layer of a high-k dielectric material; depositing a layer of a work function shifter material over a portion of the high-k dielectric material to form an overlapping region; heat treating the layer of the high-k dielectric material and the layer of the work function shifter material to as to form a transformed dielectric material via thermal diffusion that is a combination of the high-k dielectric and work function shifter materials in the overlapping region; and depositing a layer of a first replacement gate fill material to obtain multiple threshold voltages.

11 Claims, 10 Drawing Sheets

INTEGRATED CIRCUIT AND METHOD FOR FABRICATING THE SAME HAVING A REPLACEMENT GATE STRUCTURE

TECHNICAL FIELD

Embodiments of the subject matter described herein relate generally to integrated circuits and methods for fabricating integrated circuits. More particularly, the subject matter relates to integrated circuits and methods for fabricating integrated circuits having a replacement gate structure.

BACKGROUND

The prior art is replete with different techniques and processes for fabricating semiconductor devices such as metal oxide semiconductor (MOS) integrated circuits. In accordance with typical fabrication techniques, a MOS integrated circuit is formed by creating a device structure on a semiconductor substrate, where the device structure includes a gate stack formed on a layer of semiconductor material, and source and drain regions formed in the semiconductor material to define a channel region under the gate stack. Some integrated circuit devices are fabricated using a replacement gate technique; in accordance with this technique, temporary gate material (typically polycrystalline or amorphous silicon) is removed, temporarily forming a trench-like structure (hereinafter "trench"), and then replaced (filled) with a different gate metal.

Current replacement gate metal fill processes for p-type MOS integrated circuits (PMOS), for example, include the conformal deposition, typically by atomic layer deposition (ALD), of a thin layer of barrier material, such as a titanium nitride material, followed by the deposition, typically by chemical vapor deposition (CVD) of a tungsten or aluminum fill metal. However, as semiconductors are scaled smaller, for example in the 20 mm generation and smaller, the thin barrier material layer takes up a larger and larger percentage of the volume of the trench, and as such increases the resistivity of the gate beyond desirable levels. For example, in combination with tungsten or aluminum, greater than 50 Å (in thickness) of barrier material (e.g., titanium nitride) is required to achieve a p-type work function. 50 Å takes up a significant percentage of the volume of the trench, and therefore creates an undesirably high resistance in the gate structure (known as line resistance). Furthermore, some traditional fill metals, such as aluminum materials, tend to form voids if the trench is too small, for example in the size of trench that is typically formed in 20 nm and smaller generation devices.

As such, it would be desirable to provide integrated circuits and methods for fabricating integrated circuits that overcome the above-mentioned problems. It is also desirable to provide integrated circuits and methods for fabricating integrated circuits that include a replacement gate material fill technique that overcomes the above-noted difficulties currently encountered in the art. Furthermore, other desirable features and characteristics of the present invention will become apparent from the subsequent detailed description of the invention and the appended claims, taken in conjunction with the accompanying drawings, the brief summary, and this background of the invention.

BRIEF SUMMARY

Integrated circuits and methods of fabricating integrated circuits are provided herein. In an exemplary embodiment, a method of fabricating an integrated circuit includes depositing a layer of a high-k dielectric material; depositing a layer of a work function shifter material over a portion of the high-k dielectric material to form an overlapping region; heat treating the layer of the high-k dielectric material and the layer of the work function shifter material so as to form a transformed dielectric material via thermal diffusion that is a combination of the high-k dielectric material and the work function shifter material in the overlapping region; and depositing a layer of a first replacement gate fill material.

In another exemplary embodiment, an integrated circuit includes a first replacement gate structure and a second replacement gate structure. The first replacement gate structure includes a layer of a high-k dielectric material and a layer of a replacement gate fill material. The second replacement gate structure includes a layer of a transformed dielectric material and a layer of the replacement gate fill material.

In yet another exemplary embodiment, an integrated circuit includes a first replacement gate structure and a second replacement gate structure. The first replacement gate structure includes a layer of a high-k dielectric material, a layer of a conductive barrier material, and a layer of a replacement gate fill material. The second replacement gate structure includes a layer of a transformed dielectric material and a layer of the replacement gate fill material.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, and wherein:

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based integrated circuits are well known and so, in the interest of brevity, many conventional steps will only be mentioned briefly herein or will be omitted entirely without providing the well-known process details.

The techniques and technologies described herein may be utilized to fabricate MOS integrated circuit devices, including NMOS integrated circuit devices, PMOS integrated circuit devices, and CMOS integrated circuit devices. In particular, the process steps described here can be utilized in conjunction with any semiconductor device fabrication process that forms gate structures for integrated circuits, including both planar and non-planar integrated circuits. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. For example, the following figures depict the subject matter of the present disclosure as would be implemented on an exemplary FinFET structure (a three-dimensional field effect transistor (FET) provided in an elongate rectangular shape (the "fin") with the gate structure provide over three sides thereof), which are currently well known in the art With reference to FIG. 1, in one embodiment, depicted is a cross-sectional view of a partially-formed integrated circuit (IC) prior to forming the replacement gate structure therein. In particular, the IC has been designed to have formed therein two p-type FETs (pFET) 121, 123 and two n-type FETs (nFET) 120, 122. However, it will be appreciated that a given integrated circuit design may include any number of pFETs and/or nFETs. As such, FIG. 1 and the figures that follow are intended to be illustrative of the techniques that can be implemented on any type of IC including pFETs and/or nFETs.

Figure 1:
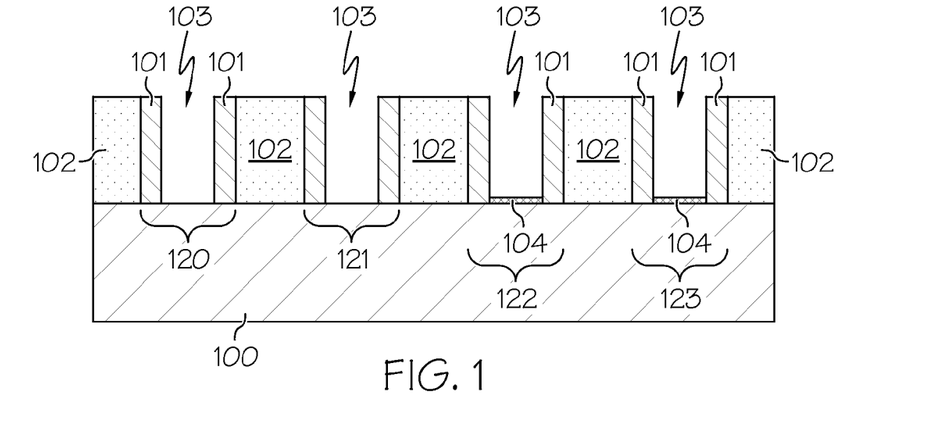
FIGS. 1-12 are cross-sectional views of an integrated circuit illustrating methods for fabricating an integrated circuit having a replacement gate structure in accordance with one embodiment of the present disclosure.

The semiconductor substrate shown in FIG. 1 includes a silicon material substrate 100. Above the silicon substrate 100 are four trench-like voids 103 (hereinafter "trenches"), one each for the two pFETs 121, 123 and the two nFETs 120, 122 to be formed. The trenches 103 are formed in a layer of oxide material 102, for example silicon dioxide, which as shown in FIG. 1 is formed above the silicon substrate 100. pFET 121 and nFET 120 are similar to pFET 123 and nFET 122, respectively, except that pFET 123 and nFET 122 have a thick gate oxide (indicated by layer 104) designed for I/O devices, as is known in the art. For purposes of the present discussion, pFETs 121, 123 can be viewed interchangeably, as with nFETs 120, 122. Sidewall spacers 101 are present on either side of the trenches 103, having been formed prior to the deposition of the layer of the oxide material. As such, FIG. 1 depicts the IC at a stage in the replacement gate forming process, prior to the deposition of any high-k, barrier, or replacement gate fill material, that is conventional and well-known in the so-called "gate last" technological arts related to ICs. As such, greater details regarding the patterning and formation of the trenches 103 in the oxide layer 102, and the formation of the sidewall spacers 101 need not be provided.

Figure 2:
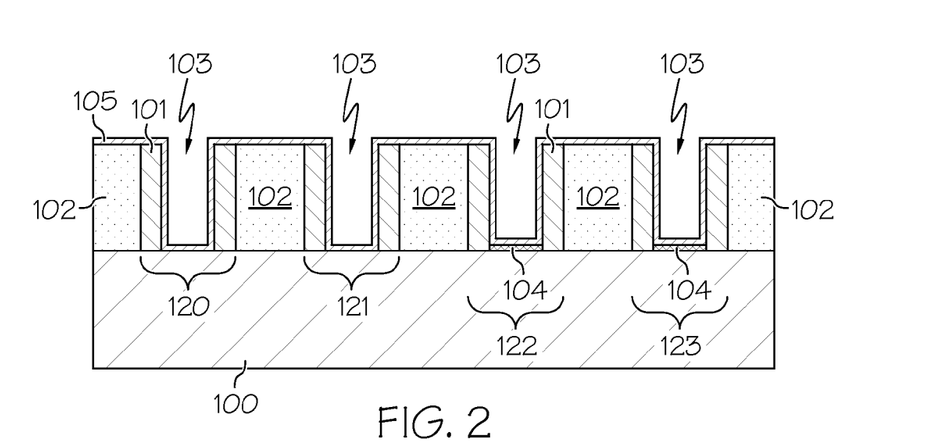

The process for forming a replacement gate structure, in one embodiment, continues with reference to FIG. 2. FIG. 2 shows a layer of a high-k insulator 105, for example a hafnium oxide material that is conformally deposited over another, second insulator layer (not shown). The second insulator layer can be made of, for example, silicon dioxide or a high-k dielectric. The second insulator layer and the layer of high-k insulator 105 are both conformally deposited over the surface of the oxide layer 102, including within the trenches 103 and along the sidewall spacers 101. In this embodiment, a hafnium oxide material was selected as the high-k insulator 105 due to its good thermal stability during subsequent annealing steps (described below) and desirable electrical properties.

Figure 3:
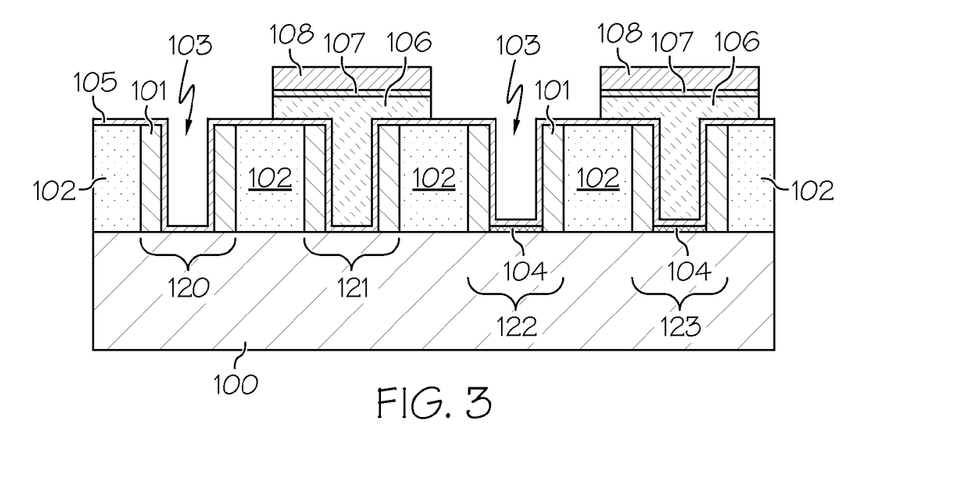

With reference now to FIG. 3, the process includes one or more lithographic etching steps. For example, as shown in FIG. 3, one or more temporary masking layers are deposited, followed by lithographic patterning and etching. For example, in one embodiment, a layer 106 of a titanium nitride ("TiN") may be deposited as a sacrificial layer to a thickness of about 10 Å to about 100 Å, followed by a soft-mask layer 107, for example an ARC layer. A photoresist material layer 108 is then provided over the soft mask layer 107. A pattern is made in the photoresist material layer 108 as is well known in the art, followed by etching. As shown in FIG. 3, the soft mask layer 107 and the TiN layer 106 were etched from the nFETs 120, 122 to expose the previously deposited layer 106. That is, the etching is performed so as to stop on the high-k layer 105. The etching can be performed using either wet etch or dry etch techniques. Conventional techniques for patterned etching are well known in the art.

Figure 4:
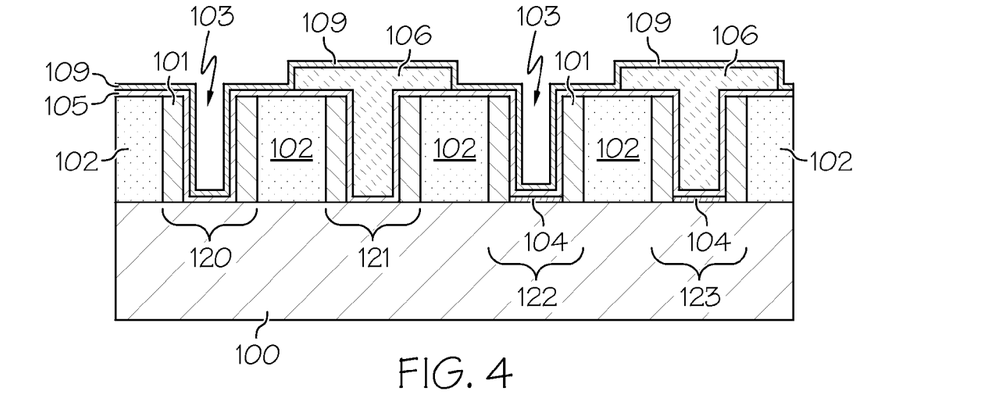

The process for forming a replacement gate structure, in one embodiment, continues with reference to FIG. 4. FIG. 4 shows a layer of a work function shifter material 109, for example a lanthanum oxide material or an aluminum oxide material, that is conformably deposited over the high-k material layer 105 (with regard to the nFETs 120, 122) and over the sacrificial TiN layer 106 (with regard to pFETs 121, 123). In this embodiment, a lanthanum oxide material or aluminum oxide material was selected as the work function shifter material due to its dipole formation properties, although other metal oxide materials may be used in other embodiments. The work function shifter material layer 109 can be conformally deposited using, for example, ALD.

Figure 5:
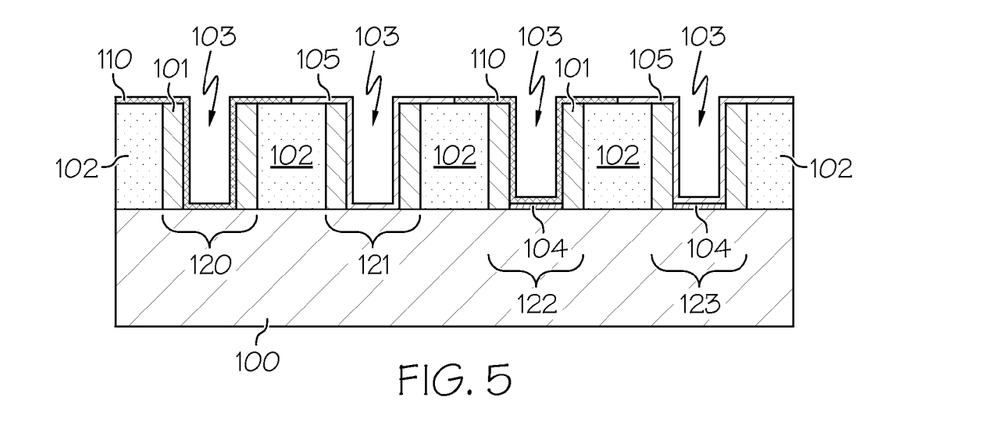
Figure 6:
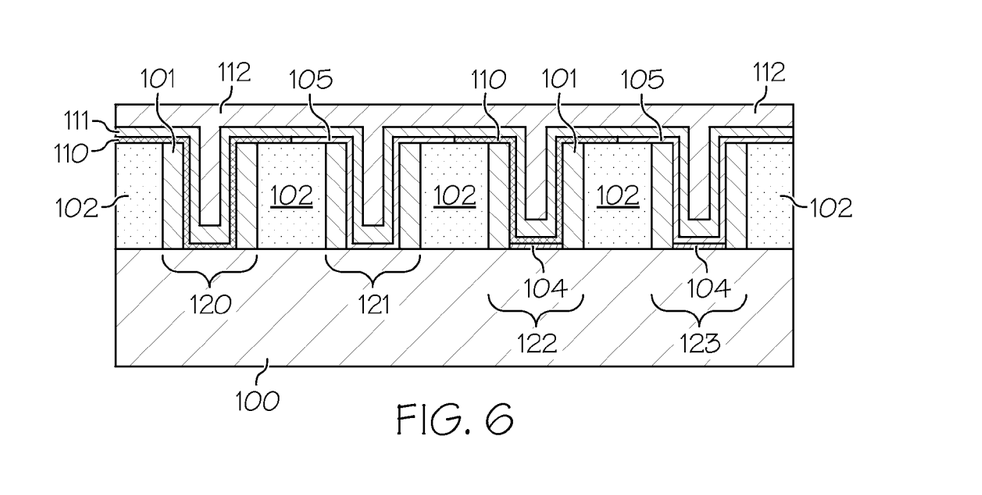
Figure 7:
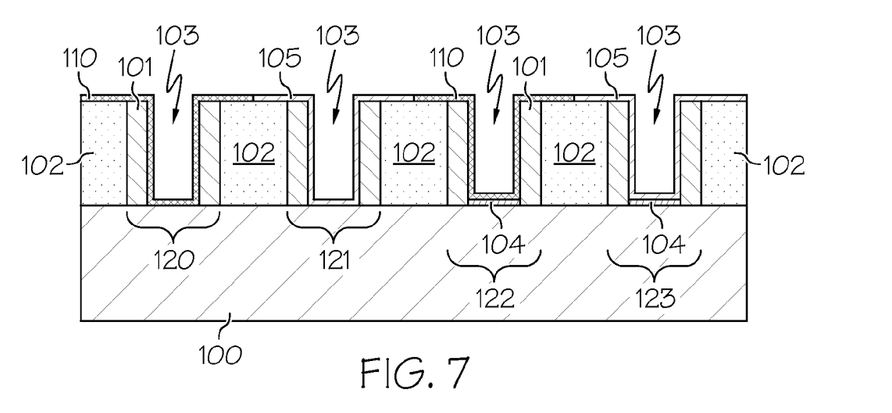

With reference now to FIG. 5, the IC is annealed or otherwise heat treated to combine, via thermal diffusion, the high-k material layer 105 and work function shifter material layer 109 where they overlap (i.e., at the nFETs 120, 122), thereby forming a single, combined layer of a transformed high-k material 110. In the embodiment wherein a hafnium oxide forms the layer 105, and a lanthanum oxide forms the layer 109, the transformed high-k dielectric layer 110 becomes a hafnium lanthanum oxide ("HfLaO$_x$"). Alternatively, in the embodiment wherein an aluminum oxide forms the layer 109, the transformed high-k dielectric layer 110 becomes a hafnium aluminum oxide ("HfAlO$_x$"). After heat treating, the sacrificial TiN layer 106 is removed, as well as the work function shifter layer 109 thereover, using, for example, patterned etching as discussed above. In some embodiments, as depicted in FIG. 6, it may be desirable to perform an additional annealing step to ensure the reliability of the high-k layers 105 and 110. This annealing would be preceded by the deposition of a single or multiple protective layers, such as, for example, a TiN layer 111 and/or a sacrificial poly-silicon layer 112, which would thereafter be removed by etching when the annealing is complete (as shown in FIG. 7).

Figure 8:
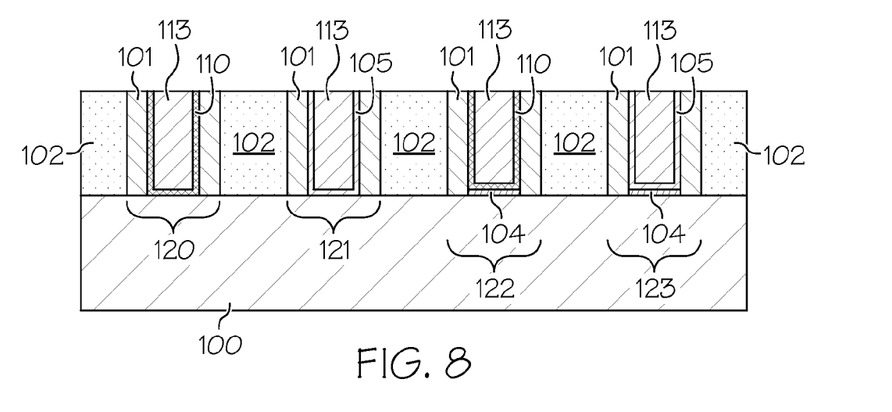

FIG. 8 depicts a further process step in the forming of a replacement gate structure, and, in one embodiment, includes the blanket deposition of a replacement gate fill material layer 113 across the IC. Fill material layer 113 can include, for example, Al, W, WN or other material (or combination of materials, including adhesion materials) that have gap-filling capabilities and low resistivity. In one embodiment, the fill material layer 113 includes a tungsten nitride material. Tungsten nitride has been found to be a desirable fill material due to its ability to fill high-aspect ratio openings, such as the trenches 103 in the depicted IC. Furthermore, the work function of tungsten nitride (which is a traditional p-type replacement gate material having a work function of about 4.8 eV) can be affected by the work function shifter material formed thereunder. For example, with regard to the nFET devices 120, 122, the HfLaO$_x$ (or HfAlO$_x$) material is formed thereunder, which reduces the effective work function of the gate stack with tungsten nitride metal to about 4.4-4.2 eV (the shift can be modulated as it depends on the thickness of the original lanthanum (or aluminum) oxide layer 109). That is, a greater thickness of lanthanum (or aluminum) in the layer lowers the effective nFET work function, after the heat treatment step. Conversely, with regard to the pFET 121, 123 devices, the hafnium oxide layer formed thereunder does not affect the work function of the tungsten nitride, leaving it as a p-type gate material with a work function of about 4.8 eV. In other examples, a similar concept can be employed using traditional n-type materials as the starting point, such as a hafnium carbide, which has a work function of about 4.4 eV. By employing a work function shifter material in combination therewith that increases the work function, such as, for example, an aluminum oxide, a pFET device can be formed (having, in this example, a work function of about 4.8 eV). As such, by selecting an appropriate work function shifter material layer for depositing under each of the nFET (120, 122) and the pFET (121, 123) devices, in combination with an appropriately selected replacement gate material, a single replacement gate material can be deposited for both nFET and pFET devices. That is, by first depositing an appropriate work function shifter material layer, there is no need to deposit separate p- and n-type replacement gate materials, as has been done previously in the art. As also shown in FIG. 8, subsequent to the deposition of the layer 113, the IC is planarized, for example using CMP.

Figure 9:
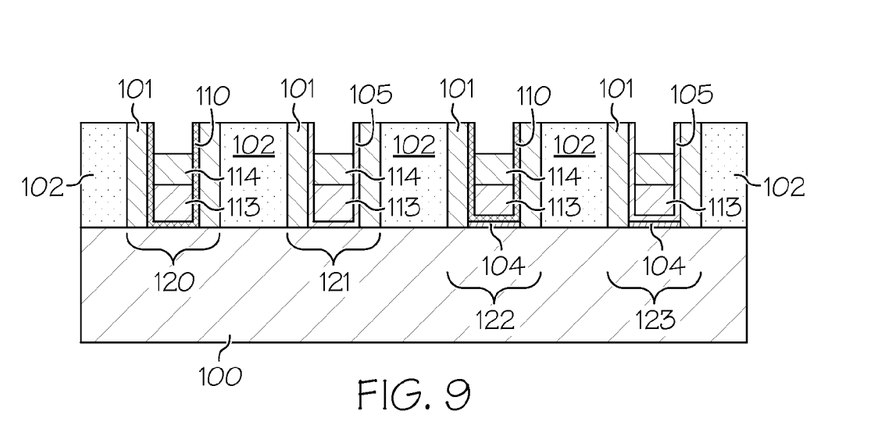

In some embodiments, as depicted with regard to FIG. 9, an optional step of isotropically etching the fill material layer 113 to reduce the thickness thereof and subsequently depositing a second fill material layer 114 is employed. The second fill material layer 114 is optionally deposited to lower the resistivity of the gate electrode structure. Using the above example of tungsten nitride as the layer 113, which has a relatively high resistivity, in particularly resistivity-sensitive applications, it may be desirable to deposit a layer 114 including tungsten, which has a much lower resistivity than tungsten nitride. As such, the overall resistivity of the gate structure will be lowered, with the inclusion of a second, lower-resistivity fill material.

Figure 10:
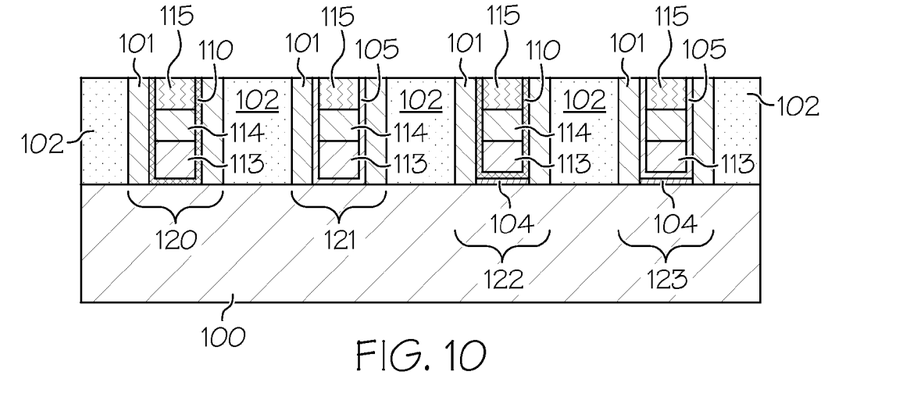
Figure 11:
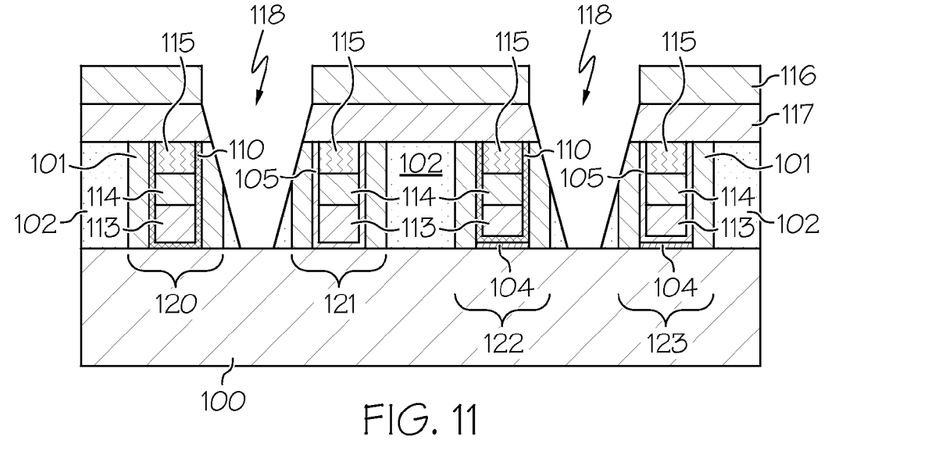
Figure 12:
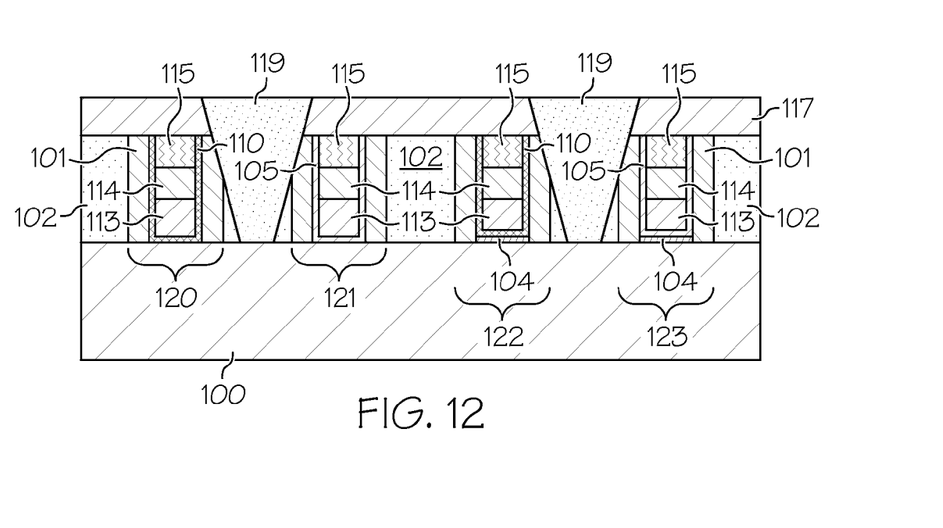

Regardless of the embodiment employed, the gate structure is complete by capping the gate structures with a dielectric capping material layer 115, for example silicon nitride, as shown in FIG. 10. Thereafter, as shown in FIGS. 11 and 12, and in accordance with one embodiment, further processing steps can be performed to fabricate the IC, as are well-known in the art. Further steps conventionally include, for example, the formation of an insulating layer 117, the formation of contacts 119 (formed by depositing a photoresist material layer 116 over the insulating layer 117, lithographic patterning, etching to form contact voids 118, and depositing a conductive material in the voids 118 to form the contacts 119), and the formation of one or more patterned conductive layers (not shown) across the device above the insulating layer 117, among many others. The subject matter disclosed herein is not intended to exclude any subsequent processing steps to form and test the completed IC as are known in the art. Furthermore, with respect to any of the process steps described above, one or more heat treating and/or annealing procedures can be employed after the deposition of a layer, as is commonly known in the art.

Figure 13:
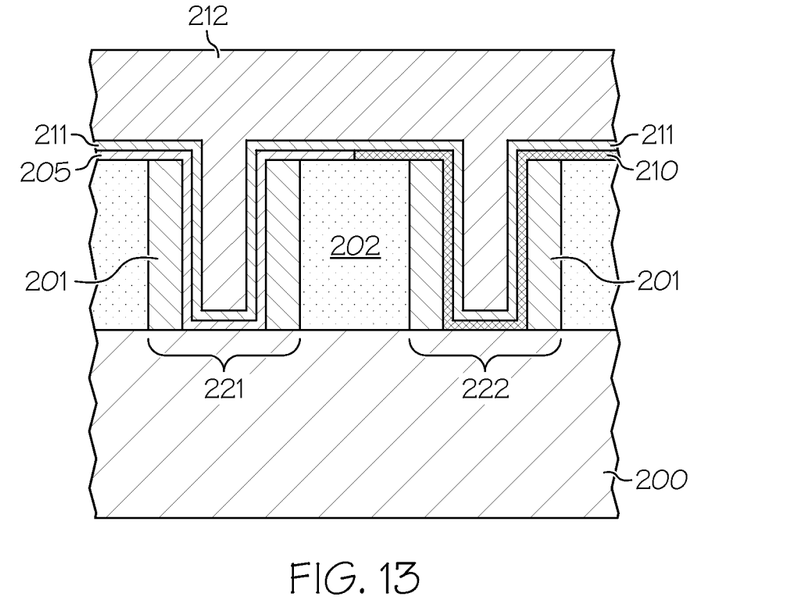
FIGS. 13-17 are cross-sectional views of an integrated circuit illustrating methods for fabricating an integrated circuit having a replacement gate structure in accordance with another embodiment of the present disclosure.
Figure 14:
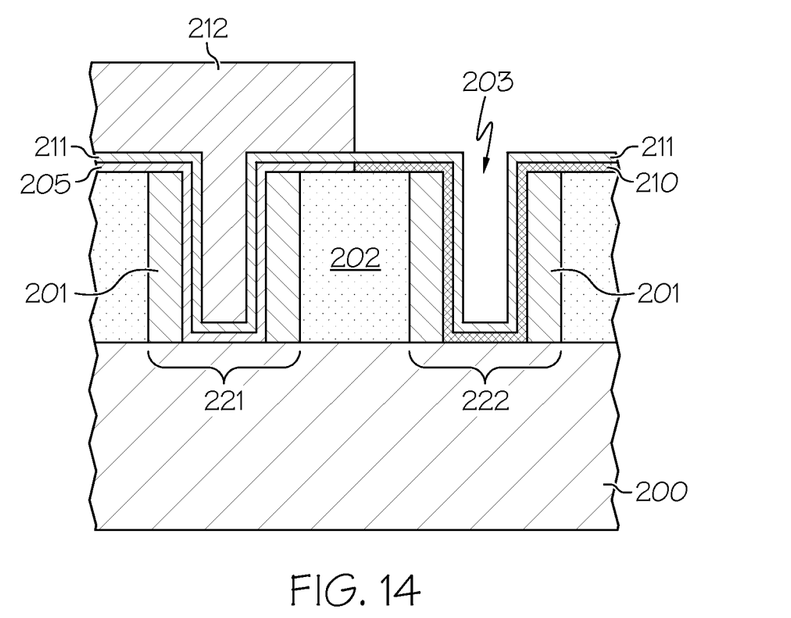
Figure 15:
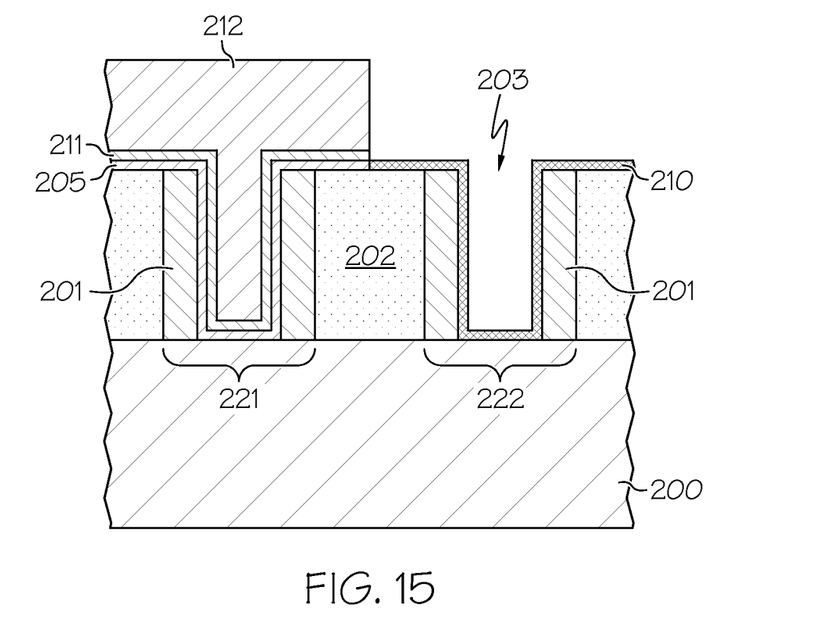
Figure 16:
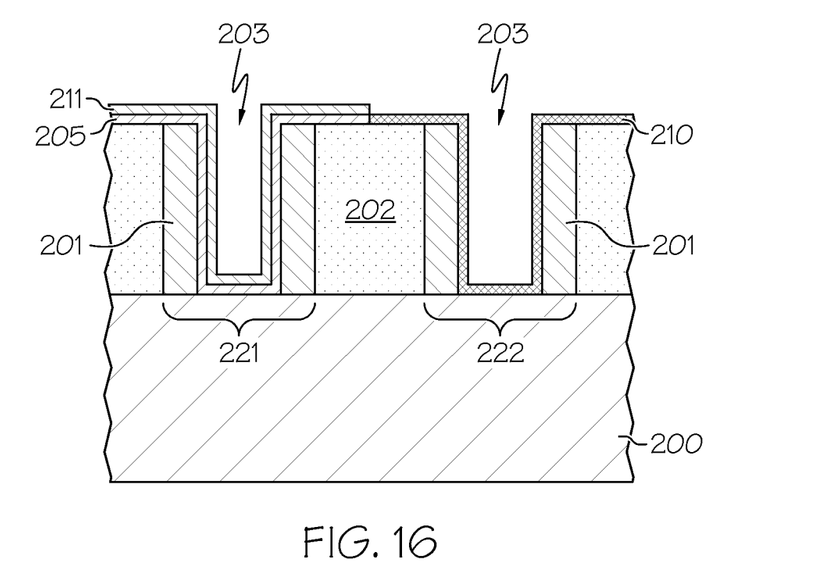

Another embodiment of the present disclosure is described with regard to FIGS. 13-17. Referring now to FIG. 13, which corresponds with FIG. 6, above, but only showing one pFET 221 and one nFET 222 (the reference numerals have been incremented by 100), the additional annealing step is performed to ensure the reliability of the high-k layers 205 and 210. This annealing would be preceded by the deposition of a single or multiple protective layers, such as, for example, a TiN layer 211 and/or a sacrificial poly-silicon layer 212. Thereafter, in this embodiment, only the sacrificial poly-silicon layer 212 is removed by etching from over the pFET 221 (FIGS. 14-16), and the protective TiN layer 211 remains over the pFET 221 as a further conductive barrier layer over the high-k layer 205, e.g., formed of a hafnium oxide. Both the layers 211 and 212 are removed from the nFET 222. As shown with regard to FIGS. 14-16, etching of the layer 212 from the pFET 221 and etching of the layers 211 and 212 from the nFET 222 can be performed using a multiple (three-step, for example, as shown) etching process, although other etching processes are considered to be within the scope of the present disclosure. First, the sacrificial poly-silicon layer 212 is removed (etched) from over the nFET 222, followed by the removal of the TiN layer 211 thereover. Subsequently, the poly-silicon layer 212 is removed from over the pFET 221.

Figure 17:
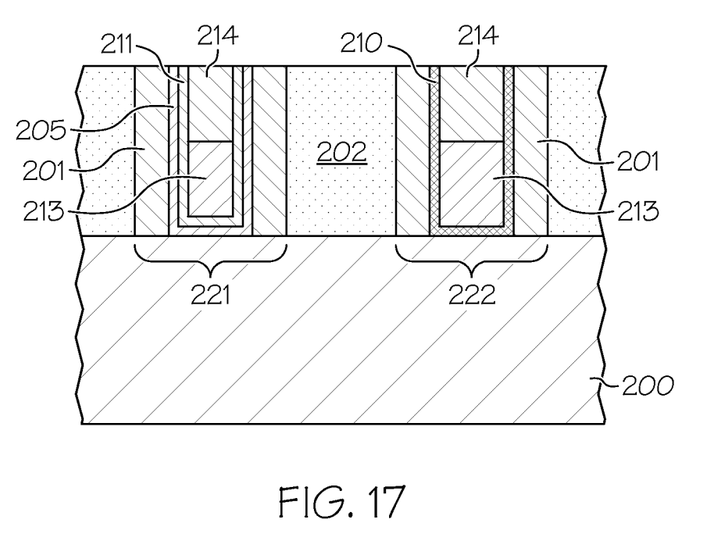
Figure 18:
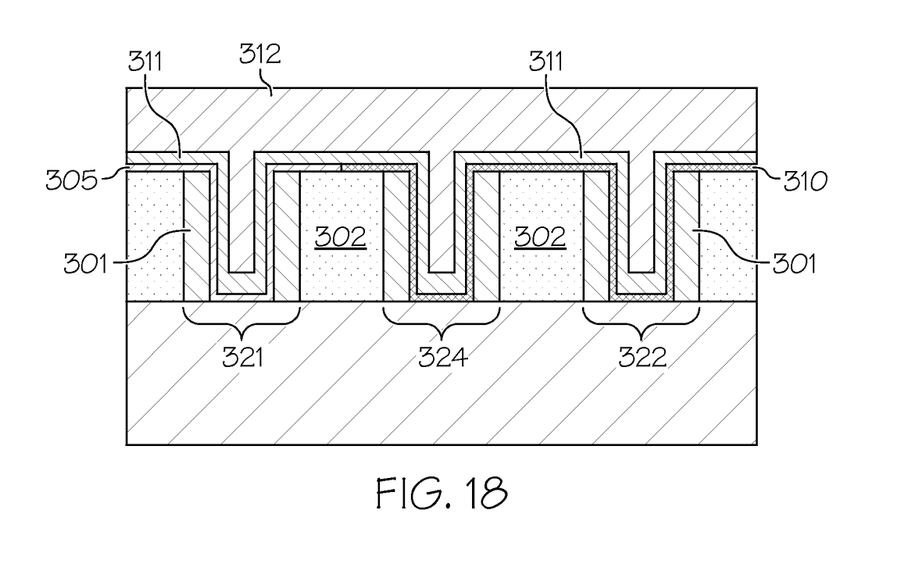
FIGS. 18-22 are cross-sectional views of an integrated circuit illustrating methods for fabricating an integrated circuit having a replacement gate structure in accordance with yet another embodiment of the present disclosure.
Figure 19:
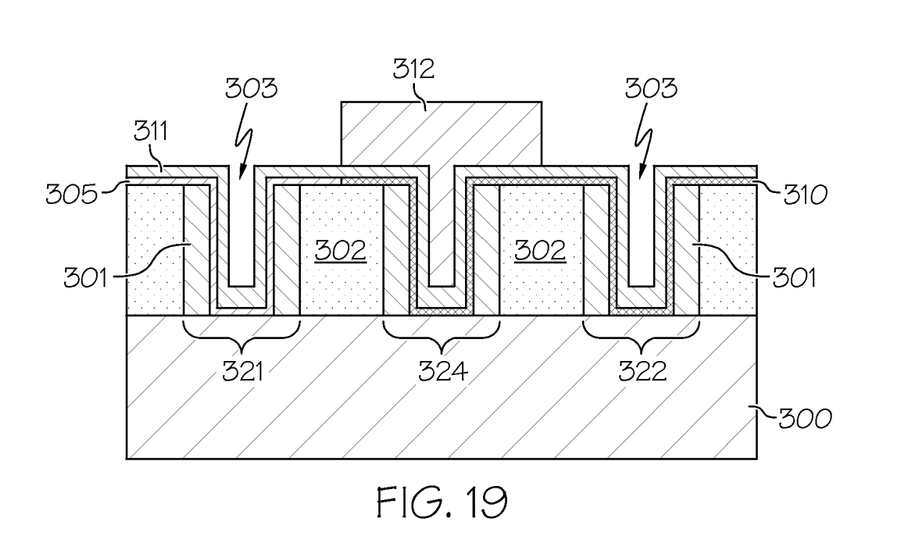
Figure 20:
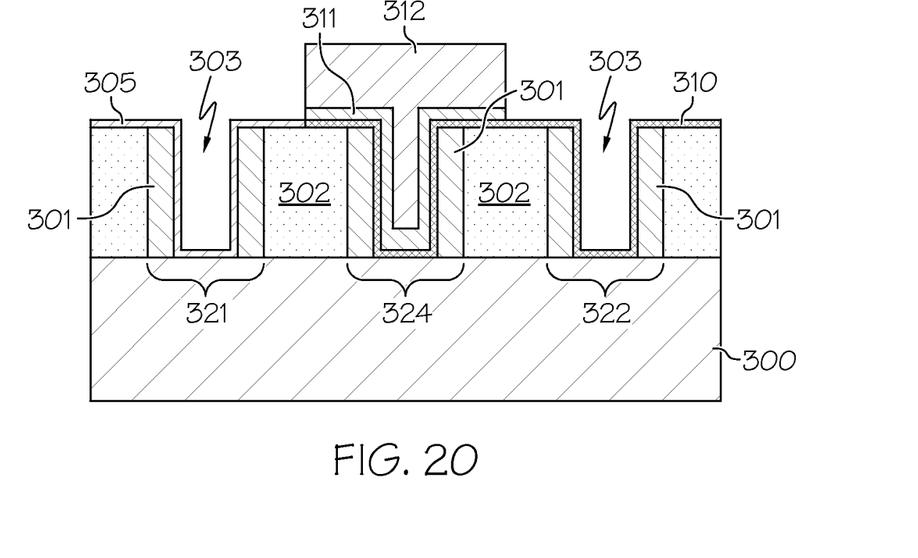
Figure 21:
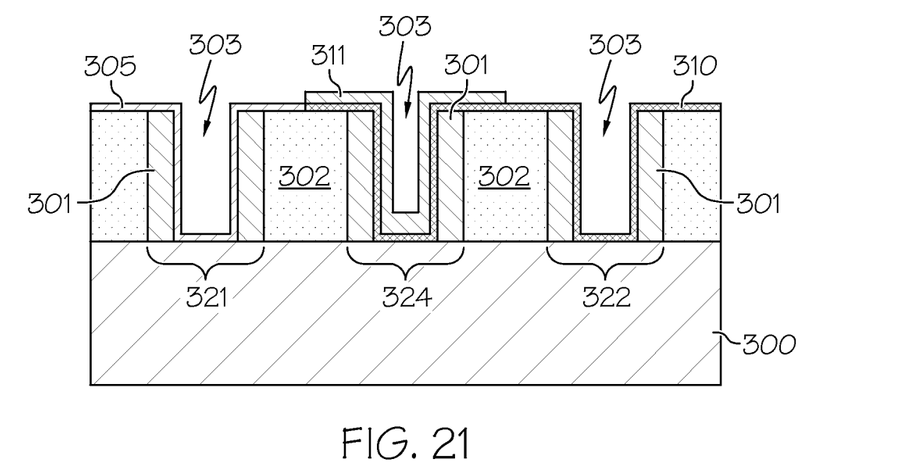
Figure 22:
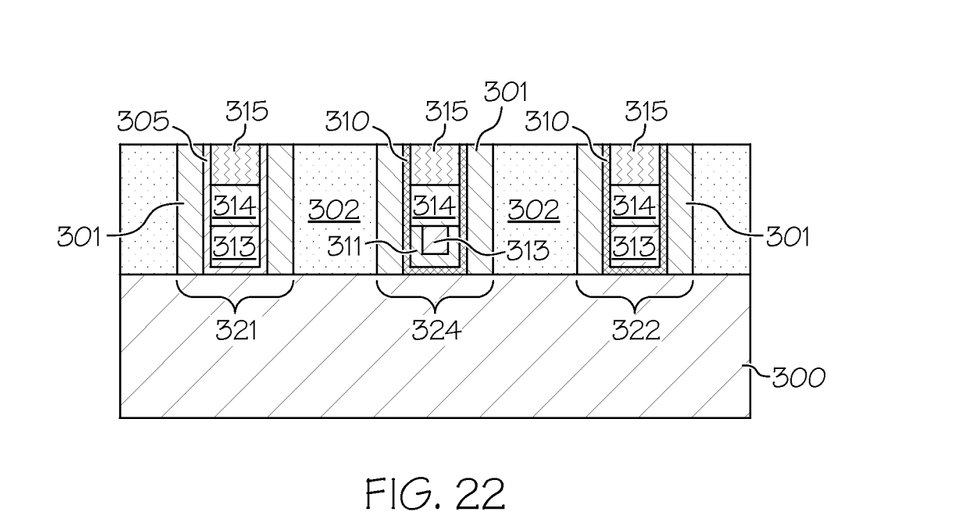

Subsequent steps in the fabrication of the IC are thereafter performed as noted above with regard to FIGS. 8-12. The finished pFET 221 and nFET 222 gate structures are shown in FIG. 17 (without the SiN cap). As shown in this embodiment, the pFET 221 includes both a barrier layer 205 of, for example, a hafnium oxide, and a second layer 211 of the TiN thereover. The addition of the TiN layer 211 in the finished pFET 221 increases the pFET work function to about 5.0 eV. As such, it will be generally appreciated that by varying the type or content of the various p- and n-side barrier layers, the respective work functions can be affected. In this example, it is also noted that the thickness of the lanthanum oxide was increase to decrease the nFET work function to about 4.2 eV when combined with the tungsten nitride fill to balance the nFET work function with respect to the increased pFET work function (relative to the embodiment described above in FIGS. 1-12).

Yet another embodiment of the present disclosure is described in connection with FIGS. 18-22 (reference numerals are incremented a further 100). As shown therein, in an exemplary embodiment where gates with three separate work functions are desired, three different gate structures can be formed: for example, an pFET 321 with a hafnium oxide layer 305, a nFET 322 with a HfLaO$_x$ combined high-k layer 310, and a third gate structure 324 with two layers: a HfLaO$_x$ combined high-k layer 310 with a TiN barrier layer 311 formed thereover. In this embodiment, the third gate structure 324 is referred to as a "mid-gap" gate structure, with a work function in between the nFET 321 hafnium oxide layer gate structure and the pFET 322 HfLaO$_x$ combined high-k layer gates. For example, in the embodiment shown, the mid-gap gate structure 324 has a work function of about 4.6 eV (the HfLaO$_x$ provides a 400 mV downward shift from the replacement gate material (e.g., tungsten nitride) and TiN having workfunction of about 5.0 eV). As such, as a general principle, it will be appreciated that the inclusion of a TiN layer over another barrier layer raises the effective work function of the resulting gate structure, and increasing amounts of lanthanum in a combined high-k layer decreases the effective work function of the resulting gate structure.

Figure 23:
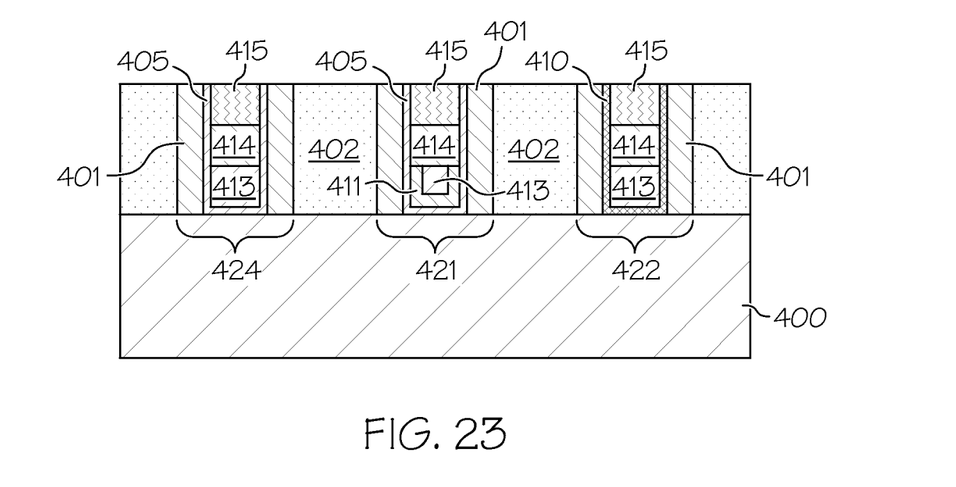
FIG. 23 is a cross-sectional view of an integrated circuit having a replacement gate structure in accordance with yet another embodiment of the present disclosure.

Yet another embodiment of the present disclosure is described in connection with FIG. 23 (reference numerals are incremented a further 100). As shown therein, in another exemplary embodiment where gates with three separate work functions are desired, three different gate structures can be formed using a "mid-gap" work function metal 413, including but not limited to tantalum carbide (TaC) or a tungsten nitride, both of which have a work function of about 4.6 eV. For example, a mid-gap gate structure 424 includes a hafnium oxide layer 405, a nFET 422 includes a HfLaO$_x$ combined high-k layer 410, and an pFET 421 includes two layers: a hafnium oxide layer 405 with a TiN barrier layer 411 formed thereover. As above, the mid-gap gate structure 424 has a work function in between the pFET 421 and the nFET 422. For example, in the embodiment shown, the mid-gap gate structure 424 has a work function of about 4.6 eV, consistent with the mid-gap work function metal 413 not-transformed by any work function shifter layers. The pFET 421 gate has a work function of about 5.0, consistent with the combination of the mid-gap metal 413 and the TiN 411 barrier layer (which, as discussed above, reduces the resulting work function). The nFET 422 gate has a work function of about 4.2, transformed by the presence of the work function shifter material layer 410 (HfLaO$_x$).

Furthermore, while the Figures presented herein have been directed to a non-planar, "fin"-type device (i.e., a "FinFET" device), the methods described herein may be employed similarly, in other embodiments, on planar devices as well. Still further, while the Figures presented herein have been direct to a "full replacement gate (or high-k last replacement gate)" IC fabrication process, the methods described herein may be employed in other embodiments in connection with "hybrid replacement gate (or high-k first replacement gate)" IC fabrication processes. For example, after the process steps described above with regard to FIG. 5, in a "hybrid replacement gate (or high-k first replacement gate)" process, an exemplary method would proceed with one or more lithographic patterning and etching steps to form the gate structures (of course, the trenches 103 would not be present, and the layers, 105, 110, 113, and 114 would be deposited over the silicon material substrate 100 including previously formed n- and p-wells). In case of a hybrid replacement gate, due to the nature of its process flow, the layers 105, 110, 113, and 114 will be found only on the bottom of the trench as they will be deposited and patterned before the "dummy" poly-Si. Afterwards, the trenches will be formed within the interlayer dielectric oxide and between spacers by removing the dummy poly-Si. Analogous gap-filling steps will be continued as shown FIG. 8 and thereafter. Hybrid (high-k first) replacement gate is a well-known process integration scheme, and as such, a person having ordinary skill in the art will readily appreciate the application of this invention to the hybrid scheme.

As such, the subject matter disclosed herein, in the various embodiments shown, includes an integrated circuit fabrication technique for forming a replacement gate structure that has numerous advantages over techniques conventionally employed in the art. For example, the deposition of a single fill material (or combination of fill materials) for each gate, whether p-type, n-type, or "mid-gap", etc., reduces the complexity of the process. Further, where tungsten nitride is employed as the fill material, it will be appreciated that tungsten nitride can be readily deposited without the additional of a "liner layer", as has been previously used in the art, thereby allowing for a greater percentage of fill material compared to the barrier material in the gate structure. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating an integrated circuit, comprising:
   providing a semiconductor substrate having a first trench and a second trench, each of the first and second trenches being defined by sidewall spacers and a silicon material at the semiconductor substrate;
   depositing a layer of a high-k dielectric material within both the first and second trenches including along and in contact with an entirety of exposed vertical walls of the sidewall spacers;
   forming a sacrificial material layer within an entirety of only the second trench and not within the first trench and in contact with the high-k dielectric material in the second trench;
   depositing a layer of a work function shifter material in the first trench over and in contact with the high-k dielectric material to form an overlapping region in the first trench, wherein the workfunction shifter material comprises an oxide of a metallic element, and wherein the entirety of the second trench remains filled by the sacrificial material and thus no work function shifter material is deposited in the second trench;
   heat treating the layer of the high-k dielectric material and the layer of the work function shifter material so as to form a transformed dielectric material via thermal diffusion that is a combination of the high-k dielectric material and work function shifter material in the overlapping region within the first trench, wherein the transformed dielectric material comprises an oxide of two metallic elements in combination;
   removing an entirety of the sacrificial material from within the second trench so as to re-expose the high-k dielectric material therein; and
   depositing a layer of a first replacement gate fill material into the first trench and over and in contact with the transformed dielectric material and into the second trench and over and in contact with the high-k dielectric material.

2. The method of claim 1, wherein depositing the layer of the high-k dielectric material comprises depositing a layer of a hafnium oxide.

3. The method of claim 1, wherein depositing the layer of the first replacement gate fill material comprises depositing a layer of a tungsten nitride.

4. The method of claim 3, further comprising etching a portion of the first replacement gate fill material to re-expose a portion of both the first and second trenches and depositing a layer of a second replacement gate fill material over the layer of the first replacement gate fill material.

5. The method of claim 4, wherein depositing the layer of the second replacement gate fill material comprises depositing a layer of tungsten.

6. The method of claim 1, wherein depositing the layer of the work function shifter material consists of depositing a layer consisting of lanthanum oxide.

7. The method of claim 6, wherein forming the transformed dielectric material consists of forming hafnium lanthanum oxide.

8. The method of claim 1, wherein depositing the layer of the work function shifter material consists of depositing a layer consisting of aluminum oxide.

9. The method of claim 8, wherein forming the transformed dielectric material consists of forming hafnium aluminum oxide.

10. A method of fabricating an integrated circuit, comprising:
providing a semiconductor substrate having a first trench and a second trench, each of the first and second trenches being defined by sidewall spacers and a silicon material at the semiconductor substrate;
depositing, by conformal deposition, a layer consisting of a hafnium oxide, high-k dielectric material within both the first and second trenches including along and in contact with an entirety of the exposed vertical walls of the sidewall spacers;
forming, by patterning and etching, a sacrificial material layer within an entirety of only the second trench and in contact with the high-k dielectric material in the second trench and not within the first trench;
depositing, by conformal deposition, a layer of a work function shifter material consisting of either aluminum oxide or lanthanum oxide in the first trench over and in contact with the high-k dielectric material to form an overlapping region in the first trench, wherein the entirety of the second trench remains filled by the sacrificial material and thus no work function shifter material is deposited in the second trench;
heat treating the layer of the high-k dielectric material and the layer of the work function shifter material so as to form a transformed dielectric material via thermal diffusion that is a combination of the high-k dielectric material and work function shifter material, thus consisting of either hafnium aluminum oxide or hafnium lanthanum oxide, in the overlapping region within the first trench;
removing an entirety of the sacrificial material from within the second trench so as to re-expose the high-k dielectric material therein;
depositing a layer of a first replacement gate electrode fill material comprising tungsten nitride into the first trench and over and in contact with the transformed dielectric material to fill an entirety of the first trench and into the second trench and over and in contact with the high-k dielectric material to fill an entirety of the second trench; and
etching a portion of the first replacement gate electrode fill material to re-expose a portion of both the first and second trenches and depositing a layer of a second replacement gate electrode fill material comprising tungsten over and in contact with the layer of the first replacement gate electrode fill material.

11. A method of fabricating an integrated circuit, comprising:
providing a semiconductor substrate having a first trench and a second trench;
depositing a layer of a high-k dielectric material within both the first and second trenches including along vertical walls of the first and second trenches;
forming a sacrificial material layer within only the second trench and not within the first trench;
depositing a layer of a work function shifter material in the first trench over the high-k dielectric material to form an overlapping region in the first trench, wherein the work-function shifter material comprises an oxide of a metallic element, and wherein the sacrificial material layer remains in the second trench and thus no work function shifter material is deposited in contact with the layer of the high-k dielectric material in the second trench;
heat treating the layer of the high-k dielectric material and the layer of the work function shifter material so as to form a transformed dielectric material via thermal diffusion that is a combination of the high-k dielectric material and work function shifter material in the overlapping region within the first trench; and
depositing a layer of a replacement gate electrode material into the first trench and over and in contact with the transformed dielectric material and into the second trench and over and in contact with the high-k dielectric material.

* * * * *